(12) United States Patent  
Davis

(10) Patent No.: US 9,231,559 B1  
(45) Date of Patent: Jan. 5, 2016

(54) VECTOR SUM CIRCUIT FOR DIGITALLY CONTROLLED WIDEBAND PHASE SHIFTER

(71) Applicant: Lockheed Martin Corporation, Bethesda, MD (US)

(72) Inventor: Brandon R. Davis, Mount Laurel, NJ (US)

(73) Assignee: Lockheed Martin Corporation, Bethesda, MD (US)

( * ) Notice: Subject to any disclaimer, the term of this patent is extended or adjusted under 35 U.S.C. 154(b) by 298 days.

(21) Appl. No.: 13/706,112

(22) Filed: Dec. 5, 2012

(51) Int. Cl.
*H03H 11/16* (2006.01)

(52) U.S. Cl.
CPC .................................... *H03H 11/16* (2013.01)

(58) Field of Classification Search
None
See application file for complete search history.

(56) References Cited

U.S. PATENT DOCUMENTS

| | | | |
|---|---|---|---|
| 6,407,629 B1 * | 6/2002 | Burri et al. | 329/347 |
| 6,696,885 B2 | 2/2004 | Christensen | |
| 6,831,497 B2 | 12/2004 | Koh et al. | |
| 7,756,219 B2 | 7/2010 | Beyer et al. | |
| 7,978,785 B2 | 7/2011 | Leifso | |

* cited by examiner

*Primary Examiner* — Michael D Yaary
(74) *Attorney, Agent, or Firm* — Howard IP Law Group, PC

(57) ABSTRACT

A vector sum circuit for producing a radio frequency (RF) output at a selectable phase offset includes an RF input configured to receive a differential pair RF input. A quadrature network produces an additional pair of RF inputs whose phase is advanced 90 degrees (90°) with reference to the first differential pair RF input, thereby producing four RF input signals offset at 0°, 90°, 180° and 270°. For each RF input signal, a set of three cascodes, having a plurality of NPN transistors and each emitter being commonly connected to an RF input. The first cascode steers current to a first output node, the second cascode steers current to a second output node and the third cascode shunts current to the voltage rail. By selectively steering current from the quadrature RF inputs to a selected output, an output signal having a desired phase shift is achieved.

13 Claims, 12 Drawing Sheets

| | | 513 | 515 | | | 505 | | | | 507 | | | | | |
|---|---|---|---|---|---|---|---|---|---|---|---|---|---|---|---|
| 501 | 503 | | 0° | | | | | | 90° | | | | | | |
| | | g | f | e | d | c | b | a | g | f | e | d | c | b | a |
| 0 | 0 | $V_0$ | $V_0$ | $V_0$ | $V_0$ | $V_0$ | $V_0$ | $V_0$ | $NV_0$ | $NV_0$ | $NV_0$ | $NV_0$ | $NV_0$ | $NV_0$ | $NV_0$ |
| 1 | 5.625 | $V_0$ | $V_0$ | $V_0$ | $V_0$ | $V_0$ | $V_0$ | $V_0$ | $NV_0$ | $NV_0$ | $NV_0$ | $NV_0$ | $NV_0$ | $NV_0$ | $V_0$ |
| 2 | 11.25 | $V_0$ | $V_0$ | $V_0$ | $V_0$ | $V_0$ | $V_0$ | $V_0$ | $NV_0$ | $NV_0$ | $NV_0$ | $NV_0$ | $NV_0$ | $V_0$ | $NV_0$ |
| 3 | 16.875 | $V_0$ | $V_0$ | $V_0$ | $V_0$ | $V_0$ | $V_0$ | $V_0$ | $NV_0$ | $NV_0$ | $NV_0$ | $NV_0$ | $NV_0$ | $V_0$ | $V_0$ |
| 4 | 22.5 | $V_0$ | $NV_0$ | $V_0$ | $V_0$ | $V_0$ | $V_0$ | $V_0$ | $NV_0$ | $NV_0$ | $NV_0$ | $NV_0$ | $V_0$ | $V_0$ | $NV_0$ |
| 5 | 28.125 | $V_0$ | $NV_0$ | $V_0$ | $V_0$ | $V_0$ | $V_0$ | $V_0$ | $NV_0$ | $NV_0$ | $NV_0$ | $V_0$ | $V_0$ | $NV_0$ | $V_0$ |
| 6 | 33.75 | $NV_0$ | $V_0$ | $V_0$ | $V_0$ | $V_0$ | $V_0$ | $V_0$ | $NV_0$ | $NV_0$ | $V_0$ | $V_0$ | $V_0$ | $NV_0$ | $V_0$ |
| 7 | 39.375 | $NV_0$ | $V_0$ | $V_0$ | $V_0$ | $V_0$ | $V_0$ | $V_0$ | $NV_0$ | $NV_0$ | $V_0$ | $V_0$ | $V_0$ | $NV_0$ | $V_0$ |
| 8 | 45 | $NV_0$ | $NV_0$ | $V_0$ | $V_0$ | $V_0$ | $V_0$ | $V_0$ | $NV_0$ | $NV_0$ | $V_0$ | $V_0$ | $V_0$ | $NV_0$ | $V_0$ |
| 9 | 50.625 | $NV_0$ | $NV_0$ | $V_0$ | $V_0$ | $V_0$ | $V_0$ | $V_0$ | $NV_0$ | $V_0$ | $V_0$ | $V_0$ | $V_0$ | $NV_0$ | $V_0$ |
| 10 | 56.25 | $NV_0$ | $NV_0$ | $NV_0$ | $V_0$ | $V_0$ | $V_0$ | $V_0$ | $NV_0$ | $V_0$ | $V_0$ | $V_0$ | $V_0$ | $NV_0$ | $V_0$ |
| 11 | 61.875 | $NV_0$ | $NV_0$ | $NV_0$ | $NV_0$ | $V_0$ | $V_0$ | $V_0$ | $V_0$ | $NV_0$ | $V_0$ | $V_0$ | $V_0$ | $NV_0$ | $V_0$ |
| 12 | 67.5 | $NV_0$ | $NV_0$ | $NV_0$ | $NV_0$ | $V_0$ | $V_0$ | $V_0$ | $V_0$ | $NV_0$ | $V_0$ | $V_0$ | $V_0$ | $NV_0$ | $V_0$ |
| 13 | 73.25 | $NV_0$ | $NV_0$ | $NV_0$ | $NV_0$ | $NV_0$ | $V_0$ | $NV_0$ | $V_0$ | $V_0$ | $V_0$ | $V_0$ | $V_0$ | $NV_0$ | $V_0$ |
| 14 | 78.75 | $NV_0$ | $NV_0$ | $NV_0$ | $NV_0$ | $NV_0$ | $V_0$ | $V_0$ | $V_0$ | $V_0$ | $V_0$ | $V_0$ | $V_0$ | $NV_0$ | $V_0$ |
| 15 | 84.375 | $NV_0$ | $NV_0$ | $NV_0$ | $NV_0$ | $NV_0$ | $NV_0$ | $NV_0$ | $V_0$ | $V_0$ | $V_0$ | $V_0$ | $V_0$ | $NV_0$ | $V_0$ |
| 16 | 90 | $NV_0$ | $NV_0$ | $NV_0$ | $NV_0$ | $NV_0$ | $NV_0$ | $NV_0$ | $V_0$ | $V_0$ | $V_0$ | $V_0$ | $V_0$ | $V_0$ | $V_0$ |
| 17 | 95.625 | $NV_0$ | $NV_0$ | $NV_0$ | $NV_0$ | $NV_0$ | $NV_0$ | $V_{CC}$ | $V_0$ | $V_0$ | $V_0$ | $V_0$ | $V_0$ | $V_0$ | $V_0$ |
| 18 | 101.25 | $NV_0$ | $NV_0$ | $NV_0$ | $NV_0$ | $NV_0$ | $V_{CC}$ | $NV_0$ | $V_0$ | $V_0$ | $V_0$ | $V_0$ | $V_0$ | $V_0$ | $V_0$ |
| 19 | 106.875 | $NV_0$ | $NV_0$ | $NV_0$ | $NV_0$ | $NV_0$ | $V_{CC}$ | $V_{CC}$ | $V_0$ | $V_0$ | $V_0$ | $V_0$ | $V_0$ | $V_0$ | $V_0$ |
| 20 | 112.5 | $NV_0$ | $NV_0$ | $NV_0$ | $NV_0$ | $V_{CC}$ | $V_{CC}$ | $NV_0$ | $V_0$ | $V_{CC}$ | $V_0$ | $V_0$ | $V_0$ | $V_0$ | $V_0$ |
| 21 | 118.125 | $NV_0$ | $NV_0$ | $NV_0$ | $NV_0$ | $V_{CC}$ | $V_{CC}$ | $V_{CC}$ | $V_0$ | $V_{CC}$ | $V_0$ | $V_0$ | $V_0$ | $V_0$ | $V_0$ |
| 22 | 123.75 | $NV_0$ | $NV_0$ | $NV_0$ | $V_{CC}$ | $V_{CC}$ | $V_{CC}$ | $V_{CC}$ | $V_{CC}$ | $V_0$ | $V_0$ | $V_0$ | $V_0$ | $V_0$ | $V_0$ |
| 23 | 129.375 | $NV_0$ | $NV_0$ | $V_{CC}$ | $V_{CC}$ | $V_{CC}$ | $V_{CC}$ | $V_{CC}$ | $V_{CC}$ | $V_0$ | $V_0$ | $V_0$ | $V_0$ | $V_0$ | $V_0$ |
| 24 | 135 | $NV_0$ | $NV_0$ | $V_{CC}$ | $V_{CC}$ | $V_{CC}$ | $V_{CC}$ | $V_{CC}$ | $V_{CC}$ | $V_{CC}$ | $V_0$ | $V_0$ | $V_0$ | $V_0$ | $V_0$ |
| 25 | 140.625 | $NV_0$ | $V_{CC}$ | $V_{CC}$ | $V_{CC}$ | $V_{CC}$ | $V_{CC}$ | $V_{CC}$ | $V_{CC}$ | $V_{CC}$ | $V_0$ | $V_0$ | $V_0$ | $V_0$ | $V_0$ |
| 26 | 146.25 | $NV_0$ | $V_{CC}$ | $V_{CC}$ | $V_{CC}$ | $V_{CC}$ | $V_{CC}$ | $V_{CC}$ | $V_{CC}$ | $V_{CC}$ | $V_{CC}$ | $V_0$ | $V_0$ | $V_0$ | $V_0$ |
| 27 | 151.875 | $V_{CC}$ | $NV_0$ | $V_{CC}$ | $V_{CC}$ | $V_{CC}$ | $V_{CC}$ | $V_{CC}$ | $V_{CC}$ | $V_{CC}$ | $V_{CC}$ | $V_{CC}$ | $V_0$ | $V_0$ | $V_{CC}$ |
| 28 | 157.5 | $V_{CC}$ | $NV_0$ | $V_{CC}$ | $V_{CC}$ | $V_{CC}$ | $V_{CC}$ | $V_{CC}$ | $V_{CC}$ | $V_{CC}$ | $V_{CC}$ | $V_{CC}$ | $V_0$ | $V_0$ | $V_{CC}$ |
| 29 | 163.125 | $V_{CC}$ | $V_{CC}$ | $V_{CC}$ | $V_{CC}$ | $V_{CC}$ | $V_{CC}$ | $V_{CC}$ | $V_{CC}$ | $V_{CC}$ | $V_{CC}$ | $V_{CC}$ | $V_{CC}$ | $V_0$ | $V_0$ |
| 30 | 168.75 | $V_{CC}$ | $V_{CC}$ | $V_{CC}$ | $V_{CC}$ | $V_{CC}$ | $V_{CC}$ | $V_{CC}$ | $V_{CC}$ | $V_{CC}$ | $V_{CC}$ | $V_{CC}$ | $V_{CC}$ | $V_0$ | $V_{CC}$ |
| 31 | 174.375 | $V_{CC}$ | $V_{CC}$ | $V_{CC}$ | $V_{CC}$ | $V_{CC}$ | $V_{CC}$ | $V_{CC}$ | $V_{CC}$ | $V_{CC}$ | $V_{CC}$ | $V_{CC}$ | $V_{CC}$ | $V_{CC}$ | $V_0$ |

| 509 — 180° | | | | | | | 511 — 270° | | | | | | |
|---|---|---|---|---|---|---|---|---|---|---|---|---|---|
| g | f | e | d | c | b | a | g | f | e | d | c | b | a |
| $V_{CC}$ | $V_{CC}$ | $V_{CC}$ | $V_{CC}$ | $V_{CC}$ | $V_{CC}$ | $V_{CC}$ | $NV_0$ | $NV_0$ | $NV_0$ | $NV_0$ | $NV_0$ | $NV_0$ | $NV_0$ |
| $V_{CC}$ | $V_{CC}$ | $V_{CC}$ | $V_{CC}$ | $V_{CC}$ | $V_{CC}$ | $V_{CC}$ | $NV_0$ | $NV_0$ | $NV_0$ | $NV_0$ | $NV_0$ | $NV_0$ | $V_{CC}$ |
| $V_{CC}$ | $V_{CC}$ | $V_{CC}$ | $V_{CC}$ | $V_{CC}$ | $V_{CC}$ | $V_{CC}$ | $NV_0$ | $NV_0$ | $NV_0$ | $NV_0$ | $NV_0$ | $V_{CC}$ | $NV_0$ |
| $V_{CC}$ | $V_{CC}$ | $V_{CC}$ | $V_{CC}$ | $V_{CC}$ | $V_{CC}$ | $V_{CC}$ | $NV_0$ | $NV_0$ | $NV_0$ | $NV_0$ | $NV_0$ | $V_{CC}$ | $V_{CC}$ |
| $V_{CC}$ | $NV_0$ | $V_{CC}$ | $V_{CC}$ | $V_{CC}$ | $V_{CC}$ | $V_{CC}$ | $NV_0$ | $NV_0$ | $NV_0$ | $NV_0$ | $V_{CC}$ | $V_{CC}$ | $NV_0$ |
| $V_{CC}$ | $NV_0$ | $V_{CC}$ | $V_{CC}$ | $V_{CC}$ | $V_{CC}$ | $V_{CC}$ | $NV_0$ | $NV_0$ | $NV_0$ | $NV_0$ | $V_{CC}$ | $V_{CC}$ | $V_{CC}$ |
| $NV_0$ | $V_{CC}$ | $V_{CC}$ | $V_{CC}$ | $V_{CC}$ | $V_{CC}$ | $V_{CC}$ | $NV_0$ | $NV_0$ | $NV_0$ | $V_{CC}$ | $V_{CC}$ | $V_{CC}$ | $V_{CC}$ |
| $NV_0$ | $V_{CC}$ | $V_{CC}$ | $V_{CC}$ | $V_{CC}$ | $V_{CC}$ | $V_{CC}$ | $NV_0$ | $NV_0$ | $V_{CC}$ | $V_{CC}$ | $V_{CC}$ | $V_{CC}$ | $V_{CC}$ |
| $NV_0$ | $NV_0$ | $V_{CC}$ | $V_{CC}$ | $V_{CC}$ | $V_{CC}$ | $V_{CC}$ | $NV_0$ | $NV_0$ | $V_{CC}$ | $V_{CC}$ | $V_{CC}$ | $V_{CC}$ | $V_{CC}$ |
| $NV_0$ | $NV_0$ | $V_{CC}$ | $V_{CC}$ | $V_{CC}$ | $V_{CC}$ | $V_{CC}$ | $NV_0$ | $V_{CC}$ | $V_{CC}$ | $V_{CC}$ | $V_{CC}$ | $V_{CC}$ | $V_{CC}$ |
| $NV_0$ | $NV_0$ | $NV_0$ | $V_{CC}$ | $V_{CC}$ | $V_{CC}$ | $V_{CC}$ | $NV_0$ | $V_{CC}$ | $V_{CC}$ | $V_{CC}$ | $V_{CC}$ | $V_{CC}$ | $V_{CC}$ |
| $NV_0$ | $NV_0$ | $NV_0$ | $NV_0$ | $V_{CC}$ | $V_{CC}$ | $V_{CC}$ | $V_{CC}$ | $NV_0$ | $V_{CC}$ | $V_{CC}$ | $V_{CC}$ | $V_{CC}$ | $V_{CC}$ |
| $NV_0$ | $NV_0$ | $NV_0$ | $NV_0$ | $V_{CC}$ | $V_{CC}$ | $V_{CC}$ | $V_{CC}$ | $NV_0$ | $V_{CC}$ | $V_{CC}$ | $V_{CC}$ | $V_{CC}$ | $V_{CC}$ |
| $NV_0$ | $NV_0$ | $NV_0$ | $NV_0$ | $NV_0$ | $V_{CC}$ | $NV_0$ | $V_{CC}$ | $V_{CC}$ | $V_{CC}$ | $V_{CC}$ | $V_{CC}$ | $V_{CC}$ | $V_{CC}$ |
| $NV_0$ | $NV_0$ | $NV_0$ | $NV_0$ | $NV_0$ | $V_{CC}$ | $V_{CC}$ | $V_{CC}$ | $V_{CC}$ | $V_{CC}$ | $V_{CC}$ | $V_{CC}$ | $V_{CC}$ | $V_{CC}$ |
| $NV_0$ | $NV_0$ | $NV_0$ | $NV_0$ | $NV_0$ | $NV_0$ | $NV_0$ | $V_{CC}$ | $V_{CC}$ | $V_{CC}$ | $V_{CC}$ | $V_{CC}$ | $V_{CC}$ | $V_{CC}$ |
| $NV_0$ | $NV_0$ | $NV_0$ | $NV_0$ | $NV_0$ | $NV_0$ | $NV_0$ | $V_{CC}$ | $V_{CC}$ | $V_{CC}$ | $V_{CC}$ | $V_{CC}$ | $V_{CC}$ | $V_{CC}$ |
| $NV_0$ | $NV_0$ | $NV_0$ | $NV_0$ | $NV_0$ | $NV_0$ | $V_0$ | $V_{CC}$ | $V_{CC}$ | $V_{CC}$ | $V_{CC}$ | $V_{CC}$ | $V_{CC}$ | $V_{CC}$ |
| $NV_0$ | $NV_0$ | $NV_0$ | $NV_0$ | $NV_0$ | $V_0$ | $NV_0$ | $V_{CC}$ | $V_{CC}$ | $V_{CC}$ | $V_{CC}$ | $V_{CC}$ | $V_{CC}$ | $V_{CC}$ |
| $NV_0$ | $NV_0$ | $NV_0$ | $NV_0$ | $NV_0$ | $V_0$ | $V_0$ | $V_{CC}$ | $NV_0$ | $V_{CC}$ | $V_{CC}$ | $V_{CC}$ | $V_{CC}$ | $V_{CC}$ |
| $NV_0$ | $NV_0$ | $NV_0$ | $NV_0$ | $V_0$ | $V_0$ | $NV_0$ | $V_{CC}$ | $NV_0$ | $V_{CC}$ | $V_{CC}$ | $V_{CC}$ | $V_{CC}$ | $V_{CC}$ |
| $NV_0$ | $NV_0$ | $NV_0$ | $NV_0$ | $V_0$ | $V_0$ | $V_0$ | $NV_0$ | $V_{CC}$ | $V_{CC}$ | $V_{CC}$ | $V_{CC}$ | $V_{CC}$ | $V_{CC}$ |
| $NV_0$ | $NV_0$ | $V_0$ | $V_0$ | $V_0$ | $V_0$ | $V_0$ | $NV_0$ | $V_{CC}$ | $V_{CC}$ | $V_{CC}$ | $V_{CC}$ | $V_{CC}$ | $V_{CC}$ |
| $NV_0$ | $NV_0$ | $V_0$ | $V_0$ | $V_0$ | $V_0$ | $V_0$ | $NV_0$ | $NV_0$ | $V_{CC}$ | $V_{CC}$ | $V_{CC}$ | $V_{CC}$ | $V_{CC}$ |
| $NV_0$ | $V_0$ | $V_0$ | $V_0$ | $V_0$ | $V_0$ | $V_0$ | $NV_0$ | $NV_0$ | $V_{CC}$ | $V_{CC}$ | $V_{CC}$ | $V_{CC}$ | $V_{CC}$ |
| $NV_0$ | $V_0$ | $V_0$ | $V_0$ | $V_0$ | $V_0$ | $V_0$ | $NV_0$ | $NV_0$ | $NV_0$ | $V_{CC}$ | $V_{CC}$ | $V_{CC}$ | $V_{CC}$ |
| $V_0$ | $NV_0$ | $V_0$ | $V_0$ | $V_0$ | $V_0$ | $V_0$ | $NV_0$ | $NV_0$ | $NV_0$ | $NV_0$ | $V_{CC}$ | $V_{CC}$ | $V_{CC}$ |
| $V_0$ | $NV_0$ | $V_0$ | $V_0$ | $V_0$ | $V_0$ | $V_0$ | $NV_0$ | $NV_0$ | $NV_0$ | $NV_0$ | $V_{CC}$ | $V_{CC}$ | $NV_0$ |
| $V_0$ | $V_0$ | $V_0$ | $V_0$ | $V_0$ | $V_0$ | $V_0$ | $NV_0$ | $NV_0$ | $NV_0$ | $NV_0$ | $V_{CC}$ | $V_{CC}$ | $V_{CC}$ |
| $V_0$ | $V_0$ | $V_0$ | $V_0$ | $V_0$ | $V_0$ | $V_0$ | $NV_0$ | $NV_0$ | $NV_0$ | $NV_0$ | $NV_0$ | $V_{CC}$ | $NV_0$ |
| $V_0$ | $V_0$ | $V_0$ | $V_0$ | $V_0$ | $V_0$ | $V_0$ | $NV_0$ | $NV_0$ | $NV_0$ | $NV_0$ | $NV_0$ | $NV_0$ | $V_{CC}$ |

| | | | | | | | | | | | | | | |
|---|---|---|---|---|---|---|---|---|---|---|---|---|---|---|
| 32 | 0 | $V_{CC}$ | $V_{CC}$ | $V_{CC}$ | $V_{CC}$ | $V_{CC}$ | $V_{CC}$ | $V_{CC}$ | $NV_0$ | $NV_0$ | $NV_0$ | $NV_0$ | $NV_0$ | $NV_0$ |
| 33 | 185.625 | $V_{CC}$ | $V_{CC}$ | $V_{CC}$ | $V_{CC}$ | $V_{CC}$ | $V_{CC}$ | $V_{CC}$ | $NV_0$ | $NV_0$ | $NV_0$ | $NV_0$ | $NV_0$ | $V_{CC}$ |
| 34 | 191.25 | $V_{CC}$ | $V_{CC}$ | $V_{CC}$ | $V_{CC}$ | $V_{CC}$ | $V_{CC}$ | $V_{CC}$ | $NV_0$ | $NV_0$ | $NV_0$ | $NV_0$ | $V_{CC}$ | $NV_0$ |
| 35 | 196.875 | $V_{CC}$ | $V_{CC}$ | $V_{CC}$ | $V_{CC}$ | $V_{CC}$ | $V_{CC}$ | $V_{CC}$ | $NV_0$ | $NV_0$ | $NV_0$ | $NV_0$ | $V_{CC}$ | $V_{CC}$ |
| 36 | 202.5 | $NV_0$ | $NV_0$ | $V_{CC}$ | $V_{CC}$ | $V_{CC}$ | $V_{CC}$ | $V_{CC}$ | $NV_0$ | $NV_0$ | $NV_0$ | $NV_0$ | $V_{CC}$ | $NV_0$ |
| 37 | 208.125 | $NV_0$ | $NV_0$ | $V_{CC}$ | $V_{CC}$ | $V_{CC}$ | $V_{CC}$ | $V_{CC}$ | $NV_0$ | $NV_0$ | $NV_0$ | $NV_0$ | $V_{CC}$ | $V_{CC}$ |
| 38 | 213.75 | $NV_0$ | $V_{CC}$ | $V_{CC}$ | $V_{CC}$ | $V_{CC}$ | $V_{CC}$ | $V_{CC}$ | $NV_0$ | $NV_0$ | $NV_0$ | $V_{CC}$ | $V_{CC}$ | $V_{CC}$ |
| 39 | 219.375 | $NV_0$ | $V_{CC}$ | $V_{CC}$ | $V_{CC}$ | $V_{CC}$ | $V_{CC}$ | $V_{CC}$ | $NV_0$ | $NV_0$ | $V_{CC}$ | $V_{CC}$ | $V_{CC}$ | $V_{CC}$ |
| 40 | 225 | $NV_0$ | $NV_0$ | $V_{CC}$ | $V_{CC}$ | $V_{CC}$ | $V_{CC}$ | $V_{CC}$ | $NV_0$ | $NV_0$ | $V_{CC}$ | $V_{CC}$ | $V_{CC}$ | $V_{CC}$ |
| 41 | 230.625 | $NV_0$ | $NV_0$ | $V_{CC}$ | $V_{CC}$ | $V_{CC}$ | $V_{CC}$ | $V_{CC}$ | $NV_0$ | $V_{CC}$ | $V_{CC}$ | $V_{CC}$ | $V_{CC}$ | $V_{CC}$ |
| 42 | 236.25 | $NV_0$ | $NV_0$ | $NV_0$ | $V_{CC}$ | $V_{CC}$ | $V_{CC}$ | $V_{CC}$ | $NV_0$ | $V_{CC}$ | $V_{CC}$ | $V_{CC}$ | $V_{CC}$ | $V_{CC}$ |
| 43 | 241.875 | $NV_0$ | $NV_0$ | $NV_0$ | $NV_0$ | $V_{CC}$ | $V_{CC}$ | $V_{CC}$ | $V_{CC}$ | $NV_0$ | $V_{CC}$ | $V_{CC}$ | $V_{CC}$ | $V_{CC}$ |
| 44 | 247.5 | $NV_0$ | $NV_0$ | $NV_0$ | $NV_0$ | $V_{CC}$ | $V_{CC}$ | $NV_0$ | $V_{CC}$ | $NV_0$ | $V_{CC}$ | $V_{CC}$ | $V_{CC}$ | $V_{CC}$ |
| 45 | 253.25 | $NV_0$ | $NV_0$ | $NV_0$ | $NV_0$ | $NV_0$ | $V_{CC}$ | $V_{CC}$ | $V_{CC}$ | $V_{CC}$ | $V_{CC}$ | $V_{CC}$ | $V_{CC}$ | $V_{CC}$ |
| 46 | 258.75 | $NV_0$ | $NV_0$ | $NV_0$ | $NV_0$ | $NV_0$ | $V_{CC}$ | $NV_0$ | $V_{CC}$ | $V_{CC}$ | $V_{CC}$ | $V_{CC}$ | $V_{CC}$ | $V_{CC}$ |
| 47 | 264.375 | $NV_0$ | $NV_0$ | $NV_0$ | $NV_0$ | $NV_0$ | $NV_0$ | $V_{CC}$ | $V_{CC}$ | $V_{CC}$ | $V_{CC}$ | $V_{CC}$ | $V_{CC}$ | $V_{CC}$ |
| 48 | 270 | $NV_0$ | $NV_0$ | $NV_0$ | $NV_0$ | $NV_0$ | $NV_0$ | $NV_0$ | $V_{CC}$ | $V_{CC}$ | $V_{CC}$ | $V_{CC}$ | $V_{CC}$ | $V_{CC}$ |
| 49 | 275.625 | $NV_0$ | $NV_0$ | $NV_0$ | $NV_0$ | $NV_0$ | $NV_0$ | $V_0$ | $V_{CC}$ | $V_{CC}$ | $V_{CC}$ | $V_{CC}$ | $V_{CC}$ | $V_{CC}$ |
| 50 | 281.25 | $NV_0$ | $NV_0$ | $NV_0$ | $NV_0$ | $NV_0$ | $V_0$ | $NV_0$ | $V_{CC}$ | $V_{CC}$ | $V_{CC}$ | $V_{CC}$ | $V_{CC}$ | $V_{CC}$ |
| 51 | 286.875 | $NV_0$ | $NV_0$ | $NV_0$ | $NV_0$ | $NV_0$ | $V_0$ | $V_0$ | $V_{CC}$ | $V_{CC}$ | $V_{CC}$ | $V_{CC}$ | $V_{CC}$ | $V_{CC}$ |
| 52 | 292.5 | $NV_0$ | $NV_0$ | $NV_0$ | $NV_0$ | $V_0$ | $V_0$ | $NV_0$ | $V_{CC}$ | $NV_0$ | $V_{CC}$ | $V_{CC}$ | $V_{CC}$ | $V_{CC}$ |
| 53 | 298.125 | $NV_0$ | $NV_0$ | $NV_0$ | $NV_0$ | $V_0$ | $V_0$ | $V_0$ | $V_{CC}$ | $NV_0$ | $V_{CC}$ | $V_{CC}$ | $V_{CC}$ | $V_{CC}$ |
| 54 | 303.75 | $NV_0$ | $NV_0$ | $NV_0$ | $V_0$ | $V_0$ | $V_0$ | $V_0$ | $NV_0$ | $V_{CC}$ | $V_{CC}$ | $V_{CC}$ | $V_{CC}$ | $V_{CC}$ |
| 55 | 309.375 | $NV_0$ | $NV_0$ | $V_0$ | $V_0$ | $V_0$ | $V_0$ | $V_0$ | $NV_0$ | $V_{CC}$ | $V_{CC}$ | $V_{CC}$ | $V_{CC}$ | $V_{CC}$ |
| 56 | 315 | $NV_0$ | $NV_0$ | $V_0$ | $V_0$ | $V_0$ | $V_0$ | $V_0$ | $NV_0$ | $NV_0$ | $V_{CC}$ | $V_{CC}$ | $V_{CC}$ | $V_{CC}$ |
| 57 | 320.625 | $NV_0$ | $V_0$ | $V_0$ | $V_0$ | $V_0$ | $V_0$ | $V_0$ | $NV_0$ | $NV_0$ | $V_{CC}$ | $V_{CC}$ | $V_{CC}$ | $V_{CC}$ |
| 58 | 326.25 | $NV_0$ | $V_0$ | $V_0$ | $V_0$ | $V_0$ | $V_0$ | $V_0$ | $NV_0$ | $NV_0$ | $NV_0$ | $V_{CC}$ | $V_{CC}$ | $V_{CC}$ |
| 59 | 331.875 | $V_0$ | $NV_0$ | $V_0$ | $V_0$ | $V_0$ | $V_0$ | $V_0$ | $NV_0$ | $NV_0$ | $NV_0$ | $NV_0$ | $V_{CC}$ | $V_{CC}$ |
| 60 | 337.5 | $V_0$ | $NV_0$ | $V_0$ | $V_0$ | $V_0$ | $V_0$ | $V_0$ | $NV_0$ | $NV_0$ | $NV_0$ | $NV_0$ | $V_{CC}$ | $NV_0$ |
| 61 | 343.125 | $V_0$ | $V_0$ | $V_0$ | $V_0$ | $V_0$ | $V_0$ | $V_0$ | $NV_0$ | $NV_0$ | $NV_0$ | $NV_0$ | $V_{CC}$ | $V_{CC}$ |
| 62 | 348.75 | $V_0$ | $V_0$ | $V_0$ | $V_0$ | $V_0$ | $V_0$ | $V_0$ | $NV_0$ | $NV_0$ | $NV_0$ | $NV_0$ | $V_{CC}$ | $NV_0$ |
| 63 | 354.375 | $V_0$ | $V_0$ | $V_0$ | $V_0$ | $V_0$ | $V_0$ | $V_0$ | $NV_0$ | $NV_0$ | $NV_0$ | $NV_0$ | $NV_0$ | $V_{CC}$ |

FIG. 5B(1)

5A 

| $V_O$ | $V_O$ | $V_O$ | $V_O$ | $V_O$ | $V_O$ | $V_O$ | $NV_0$ | $NV_0$ | $NV_0$ | $NV_0$ | $NV_0$ | $NV_0$ | $NV_0$ |
|---|---|---|---|---|---|---|---|---|---|---|---|---|---|
| $V_O$ | $V_O$ | $V_O$ | $V_O$ | $V_O$ | $V_O$ | $V_O$ | $NV_0$ | $NV_0$ | $NV_0$ | $NV_0$ | $NV_0$ | $NV_0$ | $V_O$ |
| $V_O$ | $V_O$ | $V_O$ | $V_O$ | $V_O$ | $V_O$ | $V_O$ | $NV_0$ | $NV_0$ | $NV_0$ | $NV_0$ | $NV_0$ |  | $NV_0$ |
| $V_O$ | $V_O$ | $V_O$ | $V_O$ | $V_O$ | $V_O$ | $V_O$ | $NV_0$ | $NV_0$ | $NV_0$ | $NV_0$ | $NV_0$ | $V_O$ | $V_O$ |
| $V_O$ | $V_{CC}$ | $V_O$ | $V_O$ | $V_O$ | $V_O$ | $V_O$ | $NV_0$ | $NV_0$ | $NV_0$ | $NV_0$ | $V_O$ | $V_O$ | $NV_0$ |
| $V_O$ | $V_{CC}$ | $V_O$ | $V_O$ | $V_O$ | $V_O$ | $V_O$ | $NV_0$ | $NV_0$ | $NV_0$ | $NV_0$ | $V_O$ | $V_O$ | $V_O$ |
| $V_{CC}$ | $V_O$ | $V_O$ | $V_O$ | $V_O$ | $V_O$ | $V_O$ | $NV_0$ | $NV_0$ | $NV_0$ | $V_O$ | $V_O$ | $V_O$ | $V_O$ |
| $V_{CC}$ | $V_O$ | $V_O$ | $V_O$ | $V_O$ | $V_O$ | $V_O$ | $NV_0$ | $NV_0$ | $V_O$ | $V_O$ | $V_O$ | $V_O$ | $V_O$ |
| $V_{CC}$ | $V_{CC}$ | $V_O$ | $V_O$ | $V_O$ | $V_O$ | $V_O$ | $NV_0$ | $NV_0$ | $V_O$ | $V_O$ | $V_O$ | $V_O$ | $V_O$ |
| $V_{CC}$ | $V_{CC}$ | $V_O$ | $V_O$ | $V_O$ | $V_O$ | $V_O$ | $NV_0$ | $V_O$ | $V_O$ | $V_O$ | $V_O$ | $V_O$ | $V_O$ |
| $V_{CC}$ | $V_{CC}$ | $V_{CC}$ | $V_O$ | $V_O$ | $V_O$ | $V_O$ | $NV_0$ | $V_O$ | $V_O$ | $V_O$ | $V_O$ | $V_O$ | $V_O$ |
| $V_{CC}$ | $V_{CC}$ | $V_{CC}$ | $V_{CC}$ | $V_O$ | $V_O$ | $V_O$ | $V_O$ | $NV_0$ | $V_O$ | $V_O$ | $V_O$ | $V_O$ | $V_O$ |
| $V_{CC}$ | $V_{CC}$ | $V_{CC}$ | $V_{CC}$ | $V_O$ | $V_O$ | $V_{CC}$ | $V_O$ | $NV_0$ | $V_O$ | $V_O$ | $V_O$ | $V_O$ | $V_O$ |
| $V_{CC}$ | $V_{CC}$ | $V_{CC}$ | $V_{CC}$ | $V_{CC}$ | $V_O$ | $V_O$ | $V_O$ | $V_O$ | $V_O$ | $V_O$ | $V_O$ | $V_O$ | $V_O$ |
| $V_{CC}$ | $V_{CC}$ | $V_{CC}$ | $V_{CC}$ | $V_{CC}$ | $V_O$ | $V_{CC}$ | $V_O$ | $V_O$ | $V_O$ | $V_O$ | $V_O$ | $V_O$ | $V_O$ |
| $V_{CC}$ | $V_{CC}$ | $V_{CC}$ | $V_{CC}$ | $V_{CC}$ | $V_{CC}$ | $V_O$ | $V_O$ | $V_O$ | $V_O$ | $V_O$ | $V_O$ | $V_O$ | $V_O$ |
| $NV_0$ | $NV_0$ | $NV_0$ | $NV_0$ | $NV_0$ | $NV_0$ | $NV_0$ | $V_O$ | $V_O$ | $V_O$ | $V_O$ | $V_O$ | $V_O$ | $V_O$ |
| $NV_0$ | $NV_0$ | $NV_0$ | $NV_0$ | $NV_0$ | $NV_0$ | $V_{CC}$ | $V_O$ | $V_O$ | $V_O$ | $V_O$ | $V_O$ | $V_O$ | $V_O$ |
| $NV_0$ | $NV_0$ | $NV_0$ | $NV_0$ | $NV_0$ | $V_{CC}$ | $NV_0$ | $V_O$ | $V_O$ | $V_O$ | $V_O$ | $V_O$ | $V_O$ | $V_O$ |
| $NV_0$ | $NV_0$ | $NV_0$ | $NV_0$ | $NV_0$ | $V_{CC}$ | $V_{CC}$ | $V_O$ | $V_O$ | $V_O$ | $V_O$ | $V_O$ | $V_O$ | $V_O$ |
| $NV_0$ | $NV_0$ | $NV_0$ | $NV_0$ | $V_{CC}$ | $V_{CC}$ | $V_{CC}$ | $V_O$ | $NV_0$ | $V_O$ | $V_O$ | $V_O$ | $V_O$ | $V_O$ |
| $NV_0$ | $NV_0$ | $NV_0$ | $NV_0$ | $V_{CC}$ | $V_{CC}$ | $V_{CC}$ | $V_O$ | $NV_0$ | $V_O$ | $V_O$ | $V_O$ | $V_O$ | $V_O$ |
| $NV_0$ | $NV_0$ | $NV_0$ | $V_{CC}$ | $V_{CC}$ | $V_{CC}$ | $V_{CC}$ | $NV_0$ | $V_O$ | $V_O$ | $V_O$ | $V_O$ | $V_O$ | $V_O$ |
| $NV_0$ | $NV_0$ | $V_{CC}$ | $V_{CC}$ | $V_{CC}$ | $V_{CC}$ | $V_{CC}$ | $NV_0$ | $V_O$ | $V_O$ | $V_O$ | $V_O$ | $V_O$ | $V_O$ |
| $NV_0$ | $NV_0$ | $V_{CC}$ | $V_{CC}$ | $V_{CC}$ | $V_{CC}$ | $V_{CC}$ | $NV_0$ | $NV_0$ | $V_O$ | $V_O$ | $V_O$ | $V_O$ | $V_O$ |
| $NV_0$ | $V_{CC}$ | $V_{CC}$ | $V_{CC}$ | $V_{CC}$ | $V_{CC}$ | $V_{CC}$ | $NV_0$ | $NV_0$ | $V_O$ | $V_O$ | $V_O$ | $V_O$ | $V_O$ |
| $NV_0$ | $V_{CC}$ | $V_{CC}$ | $V_{CC}$ | $V_{CC}$ | $V_{CC}$ | $V_{CC}$ | $NV_0$ | $NV_0$ | $NV_0$ | $V_O$ | $V_O$ | $V_O$ | $V_O$ |
| $V_{CC}$ | $NV_0$ | $V_{CC}$ | $V_{CC}$ | $V_{CC}$ | $V_{CC}$ | $V_{CC}$ | $NV_0$ | $NV_0$ | $NV_0$ | $NV_0$ | $V_O$ | $V_O$ | $V_O$ |
| $V_{CC}$ | $NV_0$ | $V_{CC}$ | $V_{CC}$ | $V_{CC}$ | $V_{CC}$ | $V_{CC}$ | $NV_0$ | $NV_0$ | $NV_0$ | $NV_0$ | $V_O$ | $V_O$ | $NV_0$ |
| $V_{CC}$ | $V_{CC}$ | $V_{CC}$ | $V_{CC}$ | $V_{CC}$ | $V_{CC}$ | $V_{CC}$ | $NV_0$ | $NV_0$ | $NV_0$ | $NV_0$ | $V_O$ | $V_O$ | $V_O$ |
| $V_{CC}$ | $V_{CC}$ | $V_{CC}$ | $V_{CC}$ | $V_{CC}$ | $V_{CC}$ | $V_{CC}$ | $NV_0$ | $NV_0$ | $NV_0$ | $NV_0$ | $V_O$ | $NV_0$ |  |
| $V_{CC}$ | $V_{CC}$ | $V_{CC}$ | $V_{CC}$ | $V_{CC}$ | $V_{CC}$ | $V_{CC}$ | $NV_0$ | $NV_0$ | $NV_0$ | $NV_0$ | $NV_0$ | $V_O$ | $V_O$ |

FIG. 5B(2)

VECTOR SUM CIRCUIT FOR DIGITALLY CONTROLLED WIDEBAND PHASE SHIFTER

FIELD OF THE INVENTION

This disclosure relates to digitally controlled circuits.

BACKGROUND OF THE INVENTION

In phased array systems, for example, phased array radar systems, it is often desirable to control the phase of the received and/or transmitted signal at each element of the phased array. It is desirable for such control to be achieved accurately and over a wide bandwidth of frequencies. Circuits for providing vector sums using metal oxide semiconductor field effect transistors (MOSFETs) have been developed because MOSFETs provide a large number of control states for a given size. However, the realization of a vector sum topology using NPN transistors, which provide a higher transition frequency (Ft), has proven difficult because of the footprint needed to implement a vector sum circuit using NPN transistors. For example, a six bit phase shifter has sixty-four (64) control states. Implementing a circuit having 64 or more CMOS control devices implemented as NPN transistors results in a circuit footprint that is too large to be practicable. Circuits using NPN transistors solely for the differential input pair to the circuit, but utilizing MOSFETs for current steering have provided some improvement in performance, however a circuit which achieves the full performance advantages of NPN transistors for current steering is desired.

SUMMARY

A vector sum circuit provides an RF output signal at a constant magnitude across multiple phase offsets. The vector sum circuit receives a differential RF input which is applied to a quadrature network to produce four RF inputs at phases 90° apart with respect to each other. For each RF input, three cascodes are connected in parallel such that the emitter electrodes of each transistor in the three cascodes are commonly connected to the associated RF input. The collector electrodes of each of the three cascodes are connected to one of: a first output terminal for the vector sum circuit; a second output terminal for the vector sum circuit, or a voltage rail.

The cascodes include a plurality of NPN transistors connected in a cascode configuration. For a given set of three cascodes corresponding to a given RF input, each cascode has the same number of NPN transistor which are arranged such that each NPN transistor of the first cascode corresponds to an NPN transistor in the second and third cascodes. Each corresponding set of NPN transistors defines a weighting stage for each RF input.

A control circuit applies a bias voltage to the base electrode of each NPN transistor in each cascode. For a given RF input, the control circuit provides signals to the three NPN transistors defining a weighting stage such that only one of the three associated NPN transistors conducts at a give time. In this manner, current from the RF input may be selectively steered to either the first or second output terminal or to the voltage rail.

The circuit is implemented in a space saving design where for each RF input, there are two feed lines. One of the feed lines is positioned such that is shared between the emitter electrodes of two of the three cascodes associated with the RF input. Additionally, output paths from the cascodes to the output terminals and the voltage rail may be positioned such that the output line is shared between two cascodes associated with two of the RF inputs, the two cascodes providing a path to the same output point.

BRIEF DESCRIPTION OF THE DRAWINGS

FIG. 5A(1), FIG. 5A(2), FIG. 5B(1) and FIG. 5B(2) show a table of vector sum weights for producing constant magnitude vectors for any phase angle according to an embodiment of the disclosure;

DETAILED DESCRIPTION

Figure 1:
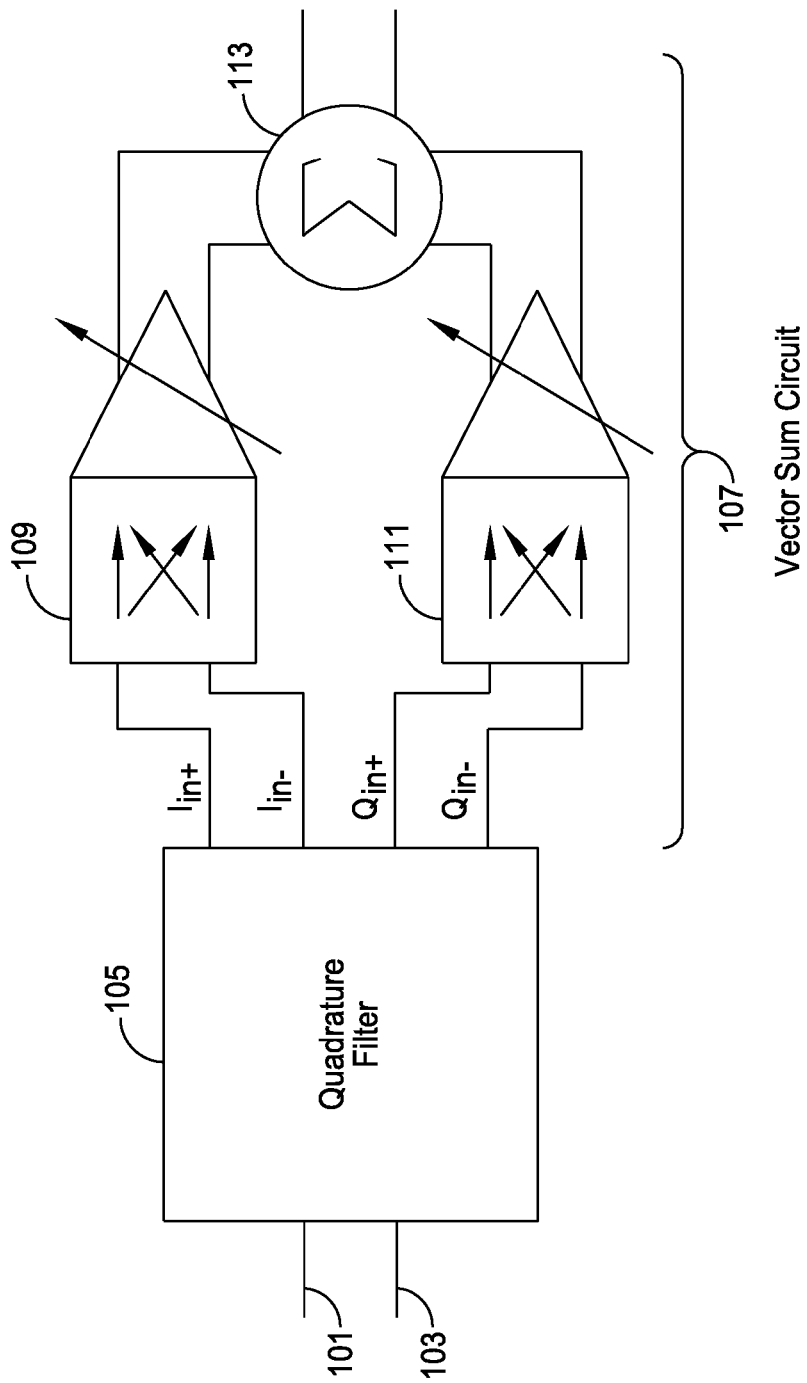
FIG. 1 is a block diagram of a vector sum circuit according to an embodiment of the disclosure.

FIG. 1 is a block diagram showing an operational flow for phase shifting input signals using a vector sum circuit according to an embodiment of the disclosure. A differential input pair 101, 103 is input to a quadrature filter 105. The quadrature filter 105 produces outputs that are 0 and 90 degrees in relation to one another. For example, a positive (+) input 101 produces an output after passing through the quadrature filter 105 of a first output ($I_{in+}$) at 0° and a second output ($Q_{in+}$) at 90°. Similarly, the differential negative input 103 will produce a first output ($I_{in-}$) at 180° and a second output ($Q_{in-}$) at 270°. A vector sum circuit 107 takes the quadrature differential outputs of the quadrature filter 105 and weights the I components 109 and the Q components 111. The weighted I and Q components are then summed at summer 113 to produce the I and Q outputs 115, 117 having the desired phase.

Figure 2:
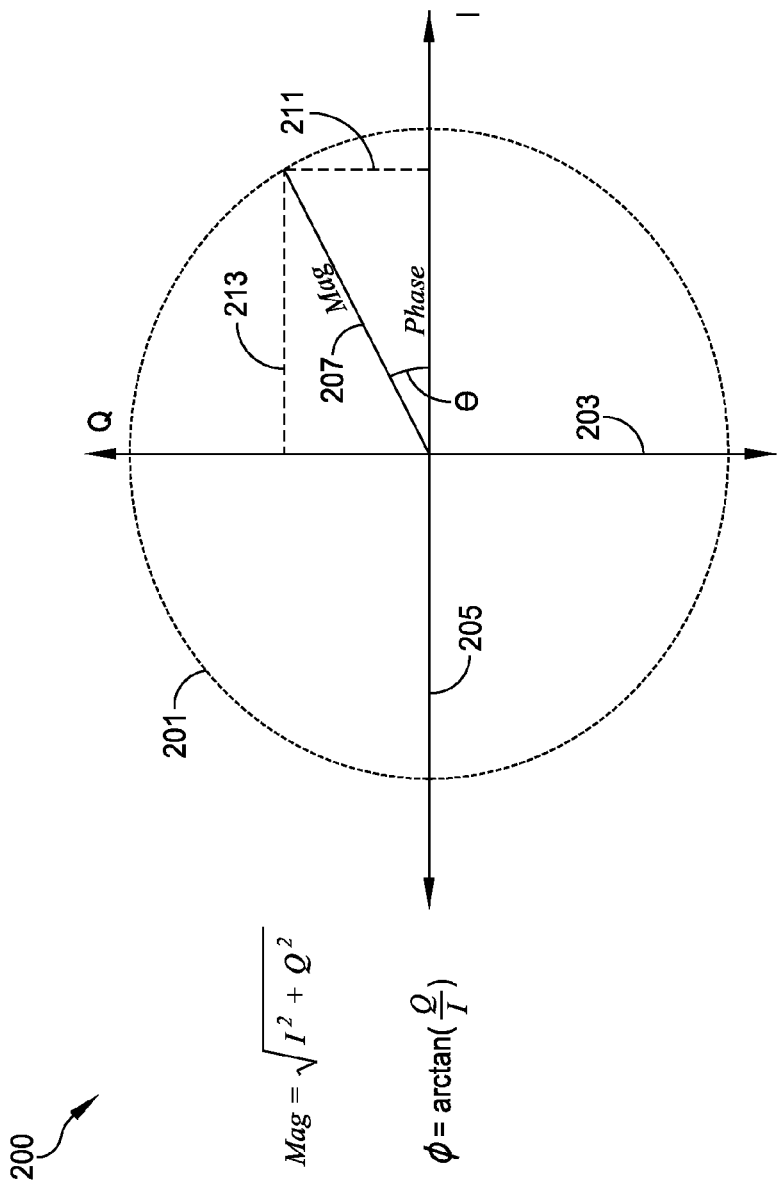
FIG. 2 is a graphical diagram illustrating a constant magnitude vector over all phase angles according to an embodiment of the disclosure.

FIG. 2 is an illustration 200 of computation of constant magnitude vector for a given phase. Circle 201 defines all phase values having a constant magnitude 207. The circle 201 is bisected by the vertical Q axis 203 and by horizontal I axis 205 which intersect to define the center of circle 201. For a given angle θ, the point on circle 201 that the vector with magnitude 207 intersects the circle 201 is defined by an I component 213 and a Q component 211. The value of magnitude 207 is determined by the Pythagorean Theorem according to:

$$\text{Mag} = \sqrt{I^2 + Q^2} \qquad \text{Equation (1)}$$

Angle θ is therefore:

$$\theta = \arctan(Q/I) \qquad \text{Equation (2)}$$

By selecting the I value 213 and the Q value 211, a vector having a constant magnitude 207 may be generated for any phase angle θ between 0° and 360°. By way of example, where I is equal to one (1) and Q is equal to zero (0), the resulting angle would be 0 degrees. If I is equal to $1/\sqrt{2}$ and Q is equal to $1/\sqrt{2}$, the resulting angle would be 45 degrees.

Summing the vectors at their proper weights is accomplished by the vector sum circuit (107 shown in FIG. 1).

Figure 3:
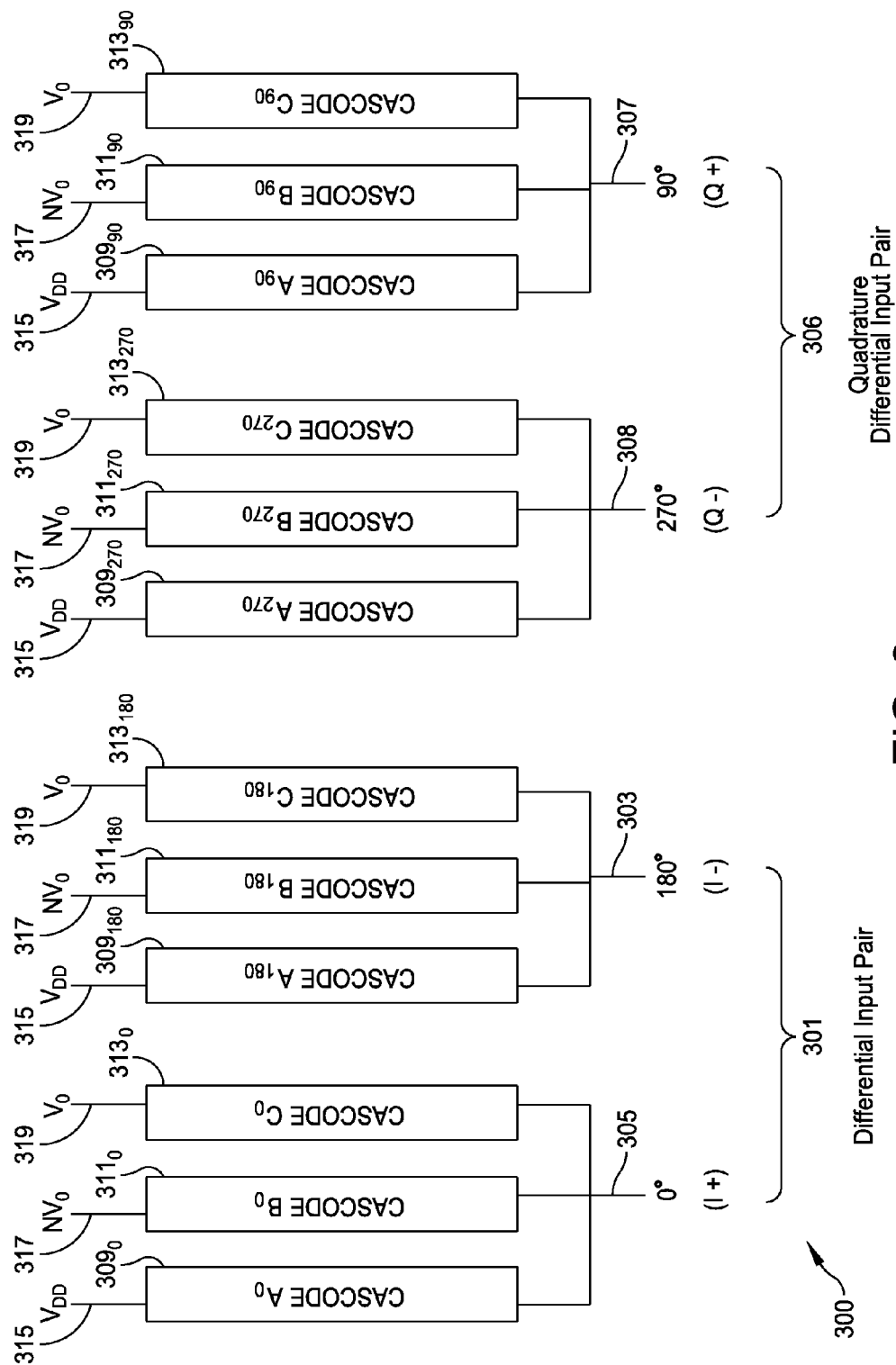
FIG. 3 is a block diagram of a vector sum circuit according to an embodiment of the disclosure.

FIG. 3 is a block diagram showing a vector sum circuit 300 according to an embodiment of the disclosure. A first differential input pair 301 provides a signal at 0° phase angle 305 and a signal at 180° 303. The signal at 0° 305 represents the positive I component (I+) of the constant magnitude vector diagram shown in FIG. 2. The signal at 180° 303 represents the negative I (I−) component of the constant magnitude vector diagram shown in FIG. 2. A second quadrature differential input pair 306 provides a signal at 270° 308 and a signal at 90° 307. The signal at 270° 308 represents the negative Q (Q−) component of the constant magnitude vector diagram shown in FIG. 2. The signal at 90° 307 represents the positive Q component (Q+) of the constant magnitude vector diagram shown in FIG. 2.

Each input 303, 305, 307, 308 is applied to three separate paths as shown in FIG. 3. Each path is defined by a plurality of cascode connected NPN transistors generally denoted as 309, 311, and 313. As discussed below in greater detail, each cascode connected set of NPN transistors is controlled in order to steer current from the differential inputs 303, 305, 307, 308 to one or more outputs 315, 317, 319. The current may be steered toward the first load, denoted $V_O$ 319, the second load $NV_O$ 317, or to the voltage rail $V_{DD}$ 315. By selectively steering current from each input at 0, 90, 180 and 270 degrees, the weights of the positive and negative I and Q components may be controlled to provide a constant amplitude vector for any desired phase angle.

Input signal 301 at 0° is applied to cascode $A_O$ 309$_O$ which steers current to the voltage rail $V_{DD}$ 315. Control signals at the base of each NPN transistor in the cascode 309$_O$ determine the amount of current from the 0° input 301 that is shunted to the voltage rail $V_{DD}$ 315. The shunted current does not reach the output nodes 317, 319 of the vector sum circuit 300 and therefore, does not contribute to the phase angle of the resulting output vector.

Input signal 301 at 0° is applied to cascode $B_O$ 311$_O$ which steers current to the second load $NV_O$ 317. Control signals at the base of each NPN transistor in the cascode 311$_O$ determine the amount of current from the 0° input 301 that is directed to the second output node 317. The current applied to the second output node 317 contributes to the positive I component for determining the phase angle of the resulting output vector.

Input signal 305 at 0° is applied to cascode $C_O$ (313$_O$) which steers current to the first load $V_O$ 319. Control signals at the base electrode of each NPN transistor in the cascode 309$_O$ determine the amount of current from the 0° input 301 that will be shunted to the voltage rail. The current applied to the second cascode 311 and the third cascode 313 contributes to the positive I (I+) component in determining the phase angle of the resulting output vector.

The inputs at 180° (303), 270° (308), and 90° (307) are applied to their corresponding cascodes A, B, C to selectively steer current to the selected output 315, 317, 319 in a manner similar to that described above with regard to the input at 0° 301. The input at 180° contributes to the negative I component (I−) of the resulting output vector. The input at 270° contributes to the negative Q component (Q−) of the resulting output vector. Finally, the input at 90° contributes to the positive Q component (Q+) of the resulting output vector.

The described vector sum operation is performed through current steering of the cascodes 309, 311, 313. This leaves the differential pairs connected to the quadrature filter (105 in FIG. 1) unchanged in terms of bias and loading for any given vector sum state. Conventional vector sum circuits control the bias of the differential pairs causing variation over different states. This causes undesired effects such as affecting the accuracy of the preceding quadrature filter, requiring extra calibration states to remove errors in the control states, and degradation in performance requiring the transistor pairs to be MOSFET devices in order to use the square law gain associated with them in order to give the proper gain steps. The disclosed vector sum circuit topology may use heterojunction bipolar transistors (HBTs), for example, SiGe HBTs which have superior performance.

Figure 4:
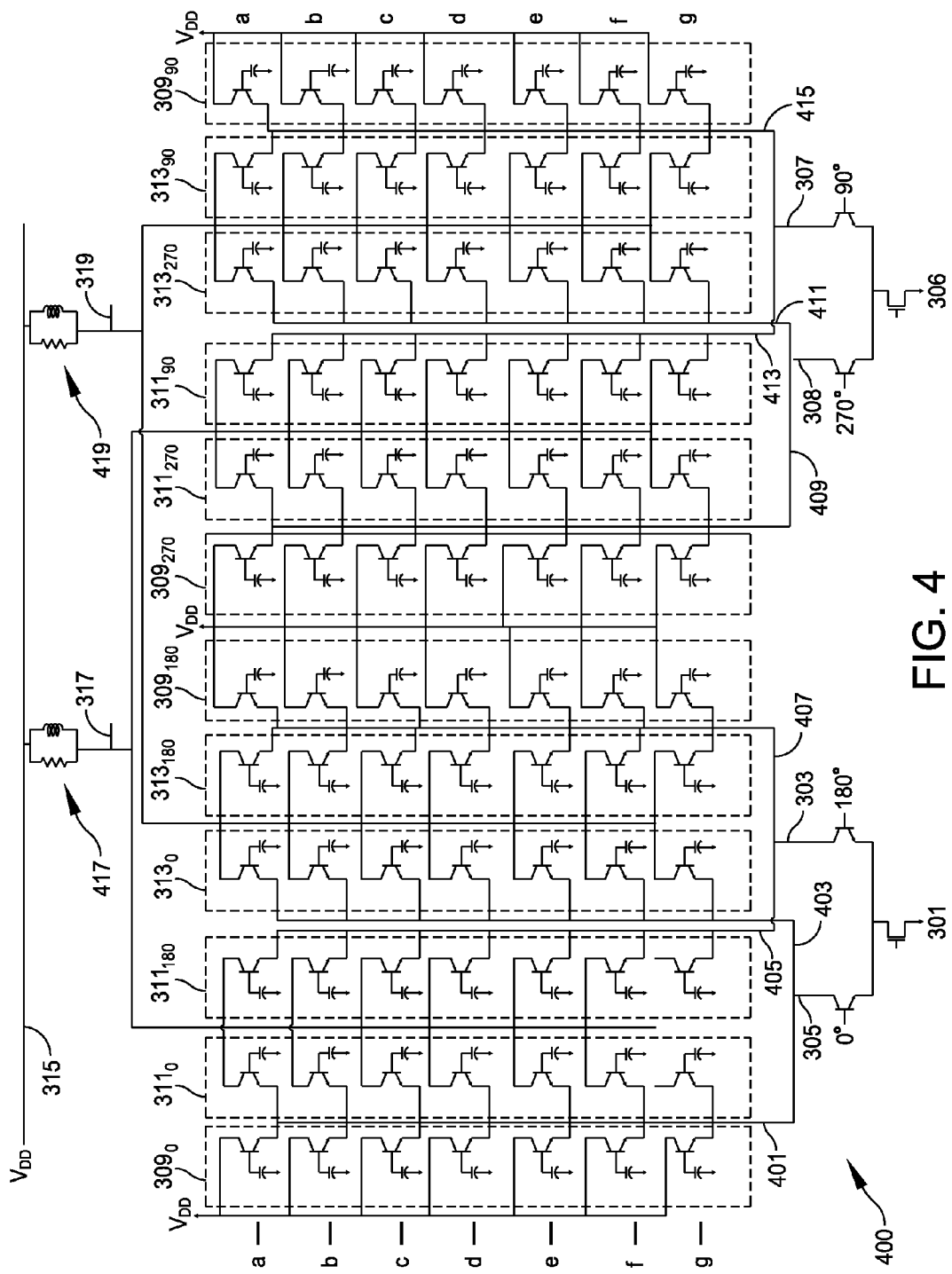
FIG. 4 is a schematic diagram of the vector sum circuit of FIG. 3.

FIG. 4 is a schematic diagram of a vector sum circuit 400 according to an exemplary embodiment. The circuit 400 receives a first differential pair input with a first input 301 having a phase of 0° (305) and a second input having a phase of 180° (303). The vector sum circuit also receives a second differential pair 306 with a first input of 270° (308) and a second input of 90° (307). The input at 0° (305) provides input to the emitters of a plurality of NPN transistors connected in a cascode fashion to create cascodes 309$_O$, 311$_O$, and 313$_O$. Each cascode 309, 311, 313 is comprised of seven NPN transistors labeled in rows as a-g. While the vector sum circuit shown in FIG. 4 depicts seven NPN transistors in each cascode, fewer or more NPN transistors may connected in a cascode configuration to define each cascade 309, 311, 313. Cascodes 309$_O$ and 311$_O$ receive the phase 0° input 305 via feed line 401 which connects each emitter of NPN transistors a-g of cascode 309$_O$ and cascode 311$_O$. Phase 0° input 305 further connects the emitters of NPN transistors in cascode 313$_O$ via feed line 403. The collectors of NPN transistors a-g in cascode 309$_O$ are connected to the voltage rail $V_{DD}$ 315. The base of each NPN transistor of cascode 309$_O$ receives a control bit which causes the NPN transistor to either be in a conducting state or a non-conducting state. A control circuit (601, shown in FIG. 6) may provide a control word containing seven control bits applied to each NPN transistor a-g in cascode 309$_O$. By selectively controlling which NPN transistors a-g are conducting in each cascade 309, 311, 313, the amount of current flowing through the cascade can be controlled. Additionally, the emitter lengths of each NPN transistor may be selected to be different from other NPN transistors in the corresponding cascade 309, 311, 313. This provides finer control over the current allowed to pass through each cascade 309, 311, 313. While current passing through cascade 309$_O$ is directed to the voltage rail $V_{DD}$ 315, the current selectively passing through cascode 311$_O$ is directed to a negative output $NV_O$ 317. Cascode 313$_O$ is configured such that current allowed to pass through cascode 313$_O$ is directed to a positive output terminal $V_O$ 319. Negative output terminal $NV_O$ 317 and positive output terminal $N_O$ 319 are separated by matching circuits 417 and 419, respectively. By selectively applying specific control words to the base electrodes of the NPN transistors a-g of cascodes 309$_O$, 311$_O$, and 313$_O$, the amount of current being directed to the positive output terminal $N_O$ 319, and the negative output terminal $NV_O$ 317 can be selectively controlled. In addition, current may be shunted back to the voltage rail $V_{DD}$ 315 through cascode 309$_O$.

In similar fashion to the first input at phase 0° (305), the second input at 180° (303) is provided as input to feed line 405 which is connected to the emitters of NPN transistors a-g making up cascode 311$_{180}$. The input at 180° (303) also serves as an input via feed line 407 which is shared between cascode 309$_{180}$ and cascode 313$_{180}$. Feed line 407 is commonly connected to each emitter of NPN transistor a-g of cascode 309$_{180}$. Each collector of NPN transistor a-g of cascode 309$_{180}$ is commonly connected to the voltage rail $V_{DD}$ 315. Feed line 407 is further commonly connected to each emitter of NPN transistor a-g of cascode 313$_{180}$. Each collector of NPN transistor a-g of cascode 313$_{180}$ is commonly connected to the positive output terminal $V_O$ 319. The base electrodes of each NPN transistor a-g in cascodes $309_{180}$, $311_{180}$ and $313_{180}$ are configured to receive a bit of a control word provided by a control circuit (not shown). Each control bit causes the corresponding NPN transistor to be in a conductive state or a non-conductive state. When in a conductive state, the current provided by the input at 180° 303 is directed to one of the voltage rail 315, the negative output node 317 or the positive output node 319 depending on the cascode $309_{180}$, $311_{180}$, $313_{180}$ that receives the corresponding control bit which operates to turn the NPN transistor "ON".

The input at phase 270° (308) is provided as input via feed line 409 to cascodes $309_{270}$ and $311_{270}$. The input at phase 270° (308) is further provided as input to cascode $313_{270}$ via feed line 411. A control word containing control bits is applied to the base electrodes of each NPN transistor a-g of cascodes $309_{270}$, $311_{270}$, $313_{270}$. Each control bit causes its corresponding NPN transistor to be in a conductive or a non-conductive state. Each conducting NPN transistors supplies a portion of the current from the input at phase 270° (308) to either the voltage rail 315 via cascode $309_{270}$, the negative output node 317 via cascode $311_{270}$ or the positive output node 319 via cascode $313_{270}$.

The input at phase 90° (307) is provided as input via feed line 415 to cascodes $309_{90}$ and $313_{90}$. The input at phase 270° is further provided as input to cascode $311_{270}$ via feed line 413. A control word containing control bits is applied to the base electrodes of each NPN transistor a-g of cascodes $309_{90}$, $311_{90}$, $313_{90}$. Each control bit causes its corresponding NPN transistor to be in a conductive or a non-conductive state. Each conducting NPN transistors supplies a portion of the current from the input at phase 90° to either the voltage rail 315 via cascode $309_{270}$, the negative output node 317 via cascode $311_{90}$ or the positive output node 319 via cascode $313_{90}$.

By selecting each code word for each cascode $309_{0,90,180,270}$, $311_{0,90,180,270}$, and $313_{0,90,180,270}$, the amount of current provided to each output may be controlled. By controlling the amount of current provided by each input 301, 303, 305, 307 to the output nodes 317, 319, a phase vector having a constant magnitude may be generated for any phase angle between 0° and 359°.

As discussed above, each of the cascodes 309, 311, 313 is digitally controlled in an "on" or "off" state. Although the cascodes 309, 311, 313 are intermixed in order to optimize the layout for size considerations, each vector (0°, 90°, 180°, 270°) has seven control weights embodied by NPN transistors a-g which may have different emitter lengths. For each vector weight (i.e. a-g) there are three states. In the first state, current is directed to the voltage rail $V_{DD}$ 315. In the second state, current is directed to the negative output terminal $NV_O$ 317. In the third state, current is directed to the positive output terminal $V_O$ 319. One and only one of the three states is selected for a given cascode vector weight.

FIG. 5A(1), FIG. 5A(2), FIG. 5B(1) and FIG. 5B(2) show a table indicating the different states for each vector weight for a given output vector phase. In the leftmost column labeled as 501, 64 states are shown. States 0-31 are shown in FIG. 5A(1) and FIG. 5A(2), while states 32-63 are shown in FIG. 5B(1) and FIG. 5B(2). Each state corresponds to an output vector phase 503. As shown in the table of FIG. 5A(1), FIG. 5A(2), FIG. 5B(1) and FIG. 5B(2), the columns are grouped according to the differential pair inputs at 0° (505), 90° (507), 180° (509) and 270° (511). FIG. 5A(1) and FIG. 5B(1) show differential inputs 0° (505) and 90° (507). Continuing from left to right respectively, FIG. 5A(2) and FIG. 5B(2) show differential inputs 180° (509) and 270° (511).

Each input 505, 507, 509, 511 is further divided into seven columns (a-g), which correspond to the NPN transistors a-g for each cascode 309, 311, 313 shown in FIG. 4. For each possible output vector phase 503, one of the three possible states is specified for each weight level in each cascode. For example, referring to FIG. 4 in conjunction with FIG. 5A(1), FIG. 5A(2), FIG. 5B(1) and FIG. 5B(2), the input at phase 0° (505) is applied via feed lines 401 and 403 which are connected to the emitter of an NPN transistor in the "g" row (shown in FIG. 4). Referring again to FIG. 5A(1) and FIG. 5A(2), in order to generate an output vector phase of 0°, the current provided by the output at phase 0° (505) is directed to the positive output terminal $V_O$ 511 as shown in FIG. 5A(1) (highlighted as box 513). Similarly, referencing the table shown in 5A(1) and FIG. 5A(2), in order to generate an output vector phase of 90°, the current provided by the input at phase 0° 505 is directed to the negative output terminal $NV_O$ (highlighted as box 515). In order to generate an output vector phase of 180°, the current provided by the input at phase 0° is directed to the voltage rail $V_{CC}$ (highlighted as box 517) as shown in FIG. 5B(1). Current from the input at phase 0° (505) may be selectively directed to the appropriate output by providing a corresponding control signal to the base terminal of the NPN transistors in row "g" corresponding to the 0° input (505). This is done by allowing the current to flow through the "g" NPN transistor in one of the three cascodes associated with the 0° input (cascodes $309_0$, $311_0$ and $313_0$ shown in FIG. 4).

The method for directing the current from the input at phase 0° (305) to the positive output terminal $V_O$ 319 will now be described with reference to FIG. 4. The input at phase 0° (305) is applied to the emitters of all of the NPN transistors making up cascodes $309_0$, $311_0$ and $313_0$ via feed lines 401 and 403. Each NPN transistor making up cascades $309_0$, $311_0$ and $313_0$ also receive a control signal at their base electrode from a control circuit (not shown). The control signal applied to the base electrode of the NPN transistor places the NPN transistor in an ON or OFF state. In an ON state, the NPN transistor conducts between its emitter and collector terminals. To direct current to the positive output terminal $V_O$ 319 from input 301, NPN transistor "g" of cascode $309_0$, connected to the voltage rail $V_{DD}$ is placed in an OFF state. NPN transistor "g" of cascode $311_0$, connected to the negative output node 317 is also placed in an OFF state. In order to contribute current from the 0° input to the negative output terminal $NV_O$, NPN transistor "g" of cascode $313_0$, connected to the positive output terminal $V_O$ 319, is placed in an ON state. The potential applied to the emitter NPN transistor "g" of cascode $313_0$ flows as current through the emitter of NPN transistor "g" through the collector to positive output terminal $V_O$ 319, thereby providing a component of the output phase vector produced by vector sum circuit 400. Referring again to FIG. 5A and FIG. 5B, 64 possible output states each correspond to a row in FIG. 5A for output vector phases between 0° and 179°, and in FIG. 5B for output vector phases between 180° and 359°. The rows indicate which output the current should be directed for each weight level corresponding to each input 505, 507, 509, 511 at each row a through g.

The output vector phase 503 is controlled by selectively turning ON or OFF each NPN transistor in each cascode 309, 311, 313. To provide fine control of the output vector phase 503, NPN transistors a through g may be configured to have different emitter lengths, thereby providing varying weights to the current contributed at each weight level associated with each row a-g. By way of example, an exemplary embodiment provides that the emitter length of each NPN transistor in row "a" is 1 μm. NPN transistors in row "b" of each cascode have an emitter length of 2 µm, NPN transistors in row "c" have an emitter length of 1.7 µm, NPN transistors in row "d" have an emitter length of 0.8 µm, NPN transistors in row "e" have an emitter length of 1.3 µm, NPN transistors in row "f" have an emitter length of 1.2 µm and NPN transistors in row "g" have an emitter length of 2 µm. These emitter lengths are provided by way of example only. It will be readily understood that other combinations of emitter lengths may be used and that the number of NPN transistors making up each cascode may be substituted or changed to suit design needs.

Figure 6:
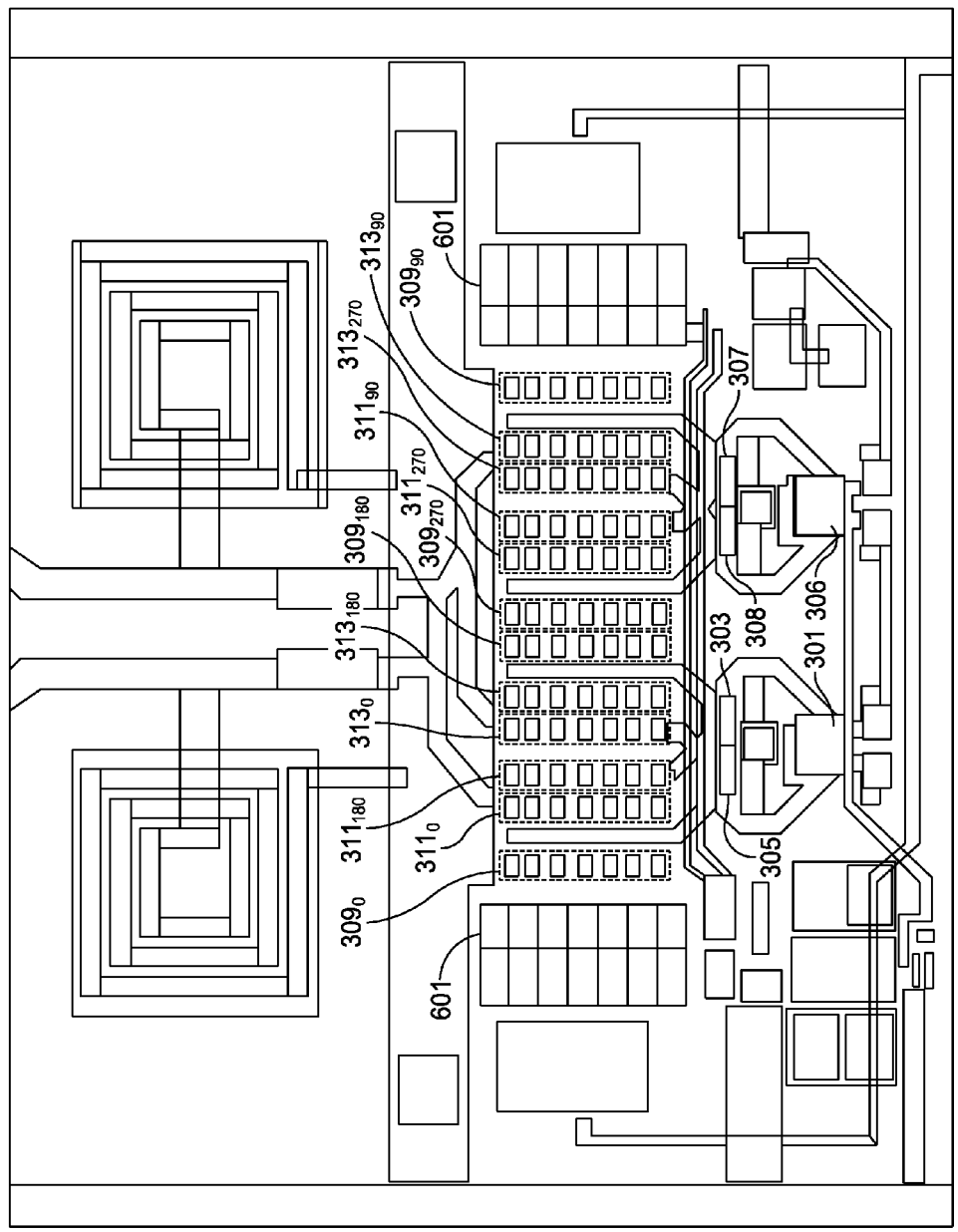
FIG. 6 is a plan view of the vector sum circuit of FIG. 4.

FIG. 6 is a plan view of an integrated circuit implementing the vector sum circuit shown in FIG. 4. Differential input pairs 301 and 306 provide an input signal at phases 0°, 180°, 270° and 90°, respectively. The inputs 303, 305, 307, 308 are applied to the commonly connected emitters of a group of NPN transistors connected in a cascode configuration. NPN transistors making up each cascade 309, 311, 313 are controlled by signals applied to the base electrodes of each NPN transistor. The control signals are generated by control circuits 601. The control circuits 601 may be configured to generate a multi bit control word. Each control bit may be encoded to control a NPN transistor at a given weighting level within 4 cascode 309, 311, 313. The control bit may be encoded into signals that are applied to the base electrodes of corresponding NPN transistors such that only one of the transistors for the given weighting level is conducting while the remaining transistors are set to an off or non-conducting status. By selecting which cascode 309, 311, 313 is conducting, the amount of current being directed to each output node is controlled. Each input phase is connected to three cascodes 309, 311, 313. The first cascode 309 connects the input with the voltage rail $V_{DD}$ when a corresponding NPN transistor is in a conducting state. The second cascode 311 connects the input with the negative output terminal $NV_0$ when a corresponding NPN transistor is in a conducting state. The third cascode 313 connects the input with the positive output terminal $V_0$ when a corresponding NPN transistor is in a conducting state. By controlling each NPN transistor or each cascode, the current provided by each input 303, 305, 307 308 can be selectively directed to a desired output. The output may contribute to the output vector for a desired phase according to the table of FIG. 5A and FIG. 5B, or the current could be shunted to the voltage rail $V_{DD}$ and not contribute a component to the output vector.

Figure 7:
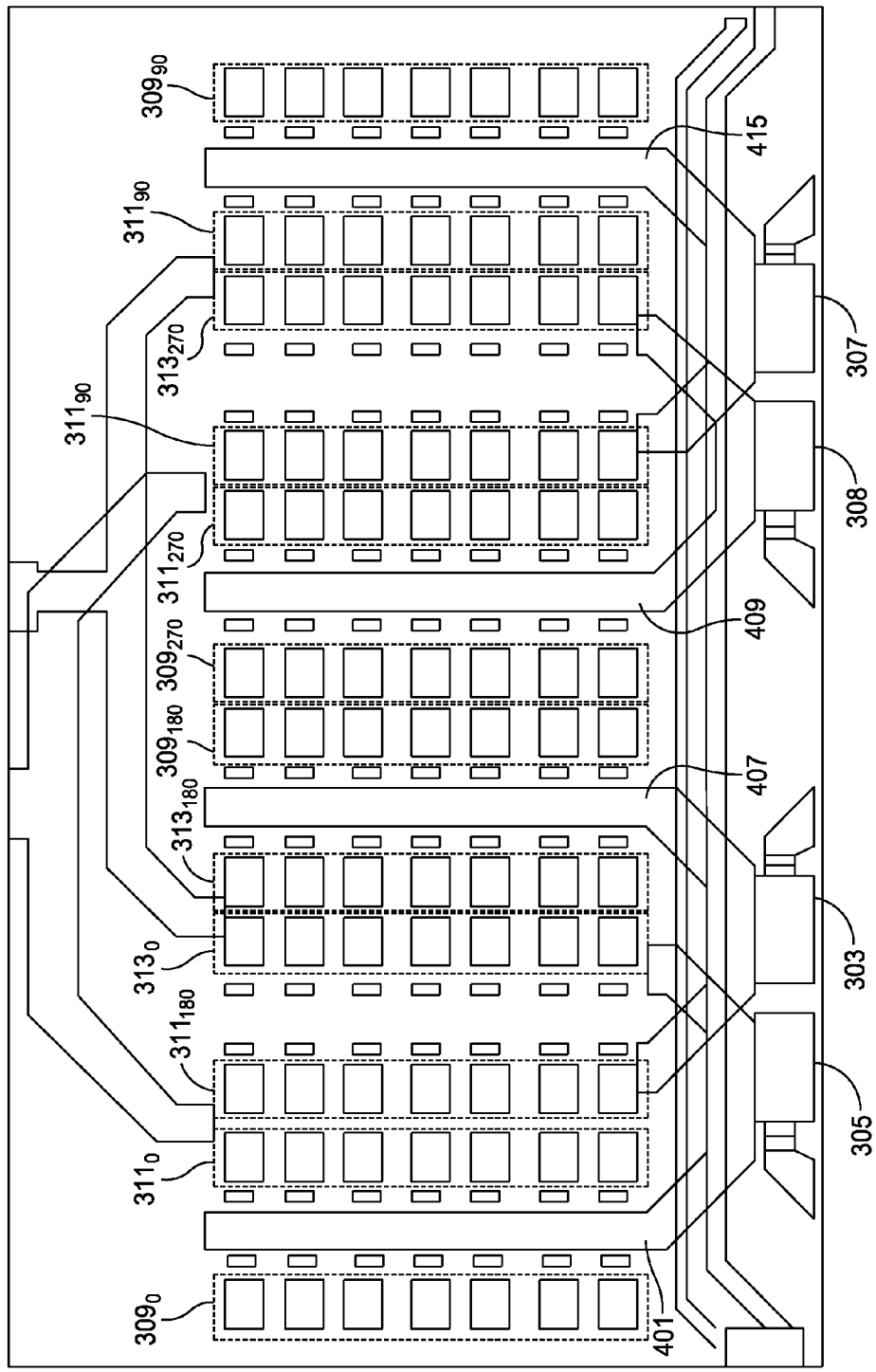
FIG. 7 is a plan view in greater detail of the vector sum circuit of FIG. 6.

FIG. 7 is a more detailed view of the cascodes of the integrated circuit shown in FIG. 6. The design of the circuit shown in FIG. 6 and FIG. 7 allow for the integrated circuit to provide fine control of the output vector phase while maintaining a small footprint. For example, the integrated circuit shown in FIG. 6 has dimensions of 300 µm by 350 µm. One means of conserving space is the sharing of feed lines from the input terminals. Referring to FIG. 7, feed lines 401, 407, 409 and 415 are shown. Feed line 401 extends from input 305 at phase 0° and lies between cascode $309_0$ and $311_0$. The emitter terminal of each NPN transistor in cascode $309_0$ and cascode $311_0$ are commonly connected to feed line 401. Feed line 407 extends from input 303 at phase 180° and lies between cascode $313_{180}$ and cascode $309_{180}$. The emitter terminal of each NPN transistor in cascode $313_{180}$ and cascode $309_{180}$ are commonly connected to feed line 407. Feed line 409 extends from input 308 at phase 270° and lies between cascode $313_{270}$ and cascode $309_{180}$. The emitter terminal of each NPN transistor in cascode $313_{180}$ and cascode $309_{180}$ are commonly connected to feed line 407.

Additionally, the capacitors associated with each base terminal of each NPN transistor (shown in the schematic diagram of FIG. 4) may be shared between corresponding NPN transistors of adjacent cascodes to conserve circuit area. Design considerations such as these allow for the use of NPN transistor which provide a higher transition frequency as compared to smaller devices such as MOSFETs in typical BiCMOS processes. The circuit components may be layered to provide the above circuit design features which allow for improved performance without requiring more space.

Figure 8:
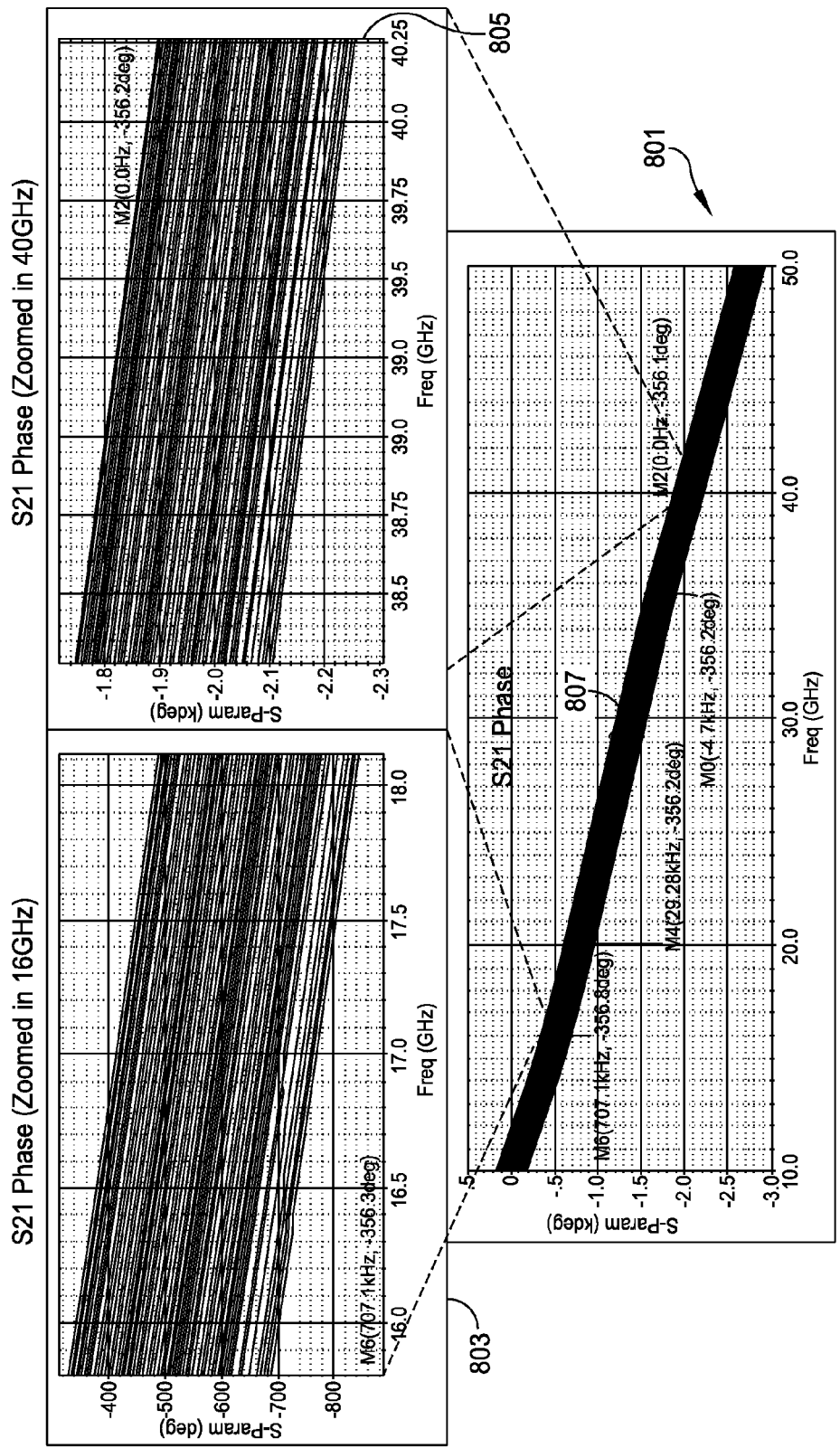
FIG. 8 is a graphical depiction of phase versus frequency for a range of phase angles generated by a vector sum circuit according to an embodiment of the disclosure.

FIG. 8 is a graphical diagram showing the output of a vector sum circuit plotted at frequency versus phase angle. Plot 801 shows the phase angles output by the vector control circuit at frequencies ranging from 10 GHz to 50 GHz. As may be seen by the band 807 of output signals, the vector sum circuit provides 360 degrees of phase coverage across all frequencies. Inset 803 shows a more detailed section of the graph shown in plot 801, in particular, the output phases at an operating frequency of 16 GHz are shown. As may be seen in inset 803, the range of output phases ranges from about −320 to about −680 degrees, providing 360 degrees of output coverage. Inset 805 shows in more detail, a section of the graph shown in plot 801, in particular, the output phases at an operating frequency of 40 GHz are shown. As may be seen in inset 803, the range of output phases ranges from about −1.74 kdeg to about −2.1 kdeg., providing 360 degrees of output coverage.

Figure 9:
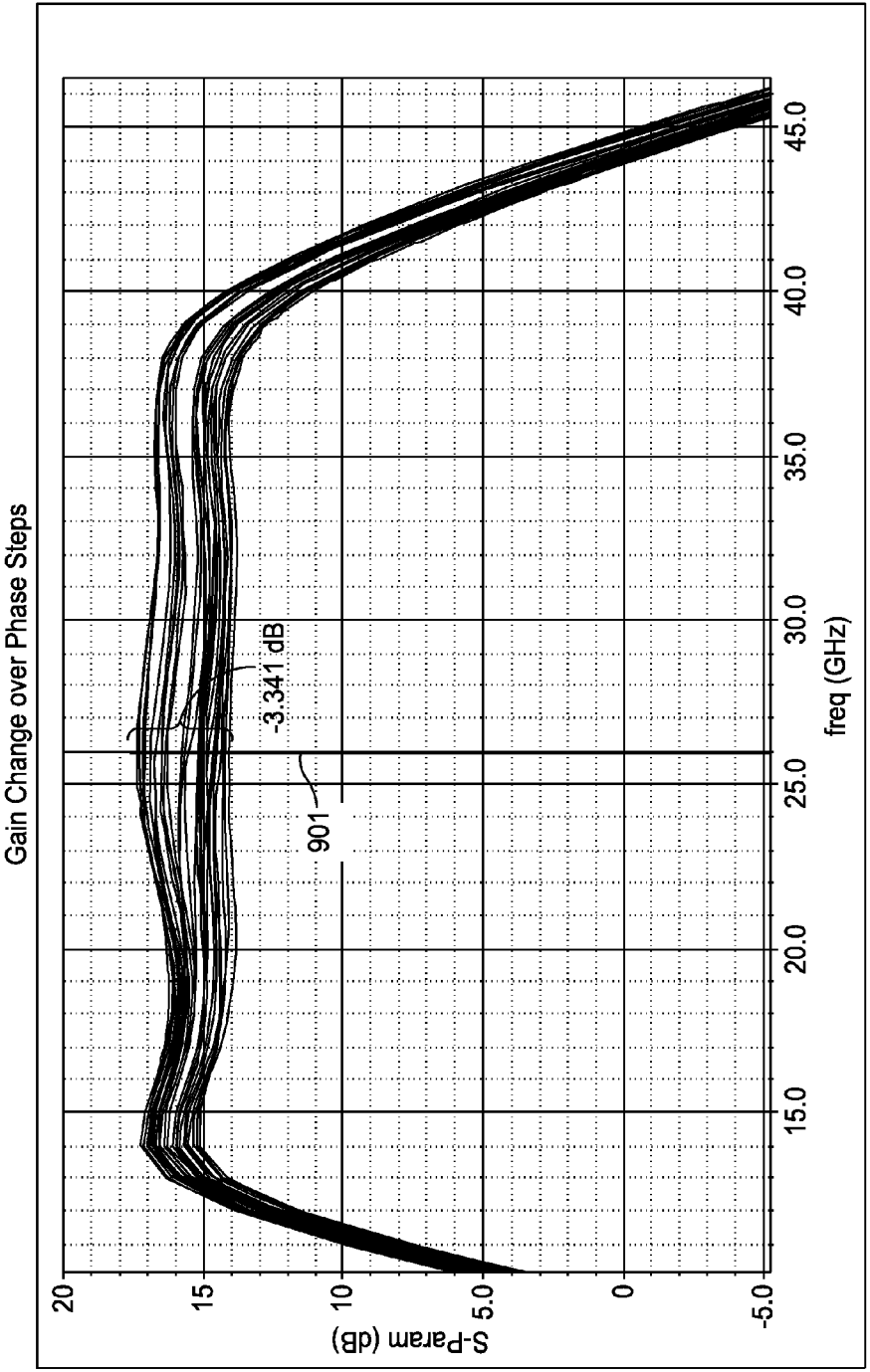
FIG. 9 is a graphical depiction of gain change over phase steps for a vector sum circuit according to an embodiment of the disclosure.

FIG. 9 is a graph showing the output of a vector sum circuit according to an embodiment of the disclosure showing frequency versus gain change over the various output phase angles. At an operating frequency of 26 GHz, the change in gain across all phase steps (shown as intersecting line 901) is only about −3.341 dB. Thus, the vector sum circuit according to an embodiment of the present disclosure provides phase control without undesired effects to the gain or noise in the channel. For this reason, the vector sum circuit described herein may be treated like any amplifier in the RF circuit, without the need for additional amplification to counter undesirable gain effects and noise.

Although the circuit and method have been described in terms of exemplary embodiments, they are not limited thereto. Rather, the appended claims should be construed broadly, to include other variants and embodiments of the disclosed circuit and method, which may be made by those skilled in the art without departing from the scope and range of equivalents.

What is claimed is:

1. A vector sum circuit for producing a radio frequency (RF) output at a selectable phase offset, comprising:
   an RF input configured to receive a differential pair RF input;
   a quadrature network configured to produce an additional pair of RF inputs whose phase is advanced 90 degrees (90°) with reference to the differential pair RF input, thereby producing four RF input signals offset at 0°, 90°, 180° and 270°;
   for each RF input signal, a set of three cascodes, each cascode comprising a plurality of NPN transistors, wherein an emitter electrode of each NPN transistor in each cascode is commonly connected to a corresponding RF input;
   a first output terminal connected to a collector electrode of each NPN transistor in a first cascode of the set of three cascodes for each RF input;
   a second output terminal connected to a collector electrode of each NPN transistor in a second cascode of the set of three cascodes for each RF input; and
   a voltage rail connected to a collector electrode of each NPN transistor in a third cascode of the set of three cascodes for each RF input, wherein a first output from said first output terminal and a second output from said second output terminal combine to define an output signal that is a vector addition of said four RF input signals.

2. The vector sum circuit of claim 1, further comprising: two feed lines extending from each RF input, wherein a first feed line of the two feed lines is shared between two of the three cascodes associated with each RF input.

3. The vector sum circuit of claim 1, further comprising a plurality of output lines extending from the collector electrodes of the cascodes to one of the first output terminal, the second output terminal or the voltage rail, wherein at least one of the output lines is shared between two cascodes associated with two of the RF inputs.

4. The vector sum circuit of claim 1, further comprising a control circuit, the control circuit configured to apply a bias voltage to a base electrode of each NPN transistor in each cascode, wherein the control circuit is further configured to provide bias voltage to the base electrodes of three corresponding NPN transistors, the three corresponding NPN transistors being associated with one RF input to define a weighting stage, and wherein the control circuit is configured to provide a bias voltage such that only one of the three corresponding NPN transistors is in a conductive state at a given time.

5. The vector sum circuit of claim 1, wherein each cascode comprises a plurality of NPN transistors connected in a cascode configuration and wherein each NPN transistor corresponds to a weighting stage for said cascode, and wherein for each set of three cascodes corresponding to one RF input, each one of the three cascodes has the same number of NPN transistors with each NPN transistor in the first cascode corresponding to an NPN transistor of the second and third cascode to define a weighting stage for an associated RF input.

6. The vector sum circuit of claim 1, wherein said NPN transistors are SiGe heterojunction bipolar transistors.

7. The vector sum circuit of claim 1, wherein said vector sum circuit is disposed in an area having dimensions of about 300 m by about 350 m.

8. A method of controlling phase in a vector sum circuit comprising the steps of:
applying a differential pair radio frequency (RF) input to a quadrature filter to produce two sets of differential input pair that are offset by 90° with respect to each other;
for each input in the two sets of differential inputs, applying the input to three cascodes, wherein a first cascode in connected to a first output load of the vector sum circuit, a second cascode is connected to a second output load of the vector sum circuit, and a third cascode is connected to a voltage rail;
digitally controlling each cascode such that a selected first portion of each input is steered to said first output load, a selected second portion of the input is steered to said second output load and a selected third portion of the input is steered to the voltage rail; and
combining the selected first portion of each input in the two sets of differential inputs to produce a constant magnitude output having a selected phase shift that is an addition of the vectors of each input in the two sets of differential inputs.

9. The method of claim 8, wherein each of said cascodes comprises a plurality of NPN transistors connected in a cascode configuration and each of said plurality of NPN transistors has an associated weight, and wherein said method further comprises:
applying a control signal to the base electrode of each NPN transistor of each cascode such that for a given NPN transistor weight only one of said first cascode, second cascode and third cascode receives a control signal to place the NPN transistor into a conductive state.

10. The method of claim 9, further comprising:
generating, in a control circuit, a multi-bit control word;
decoding each bit in the multi-bit control word to produce an input signal;
applying the input signal to the base electrode of a NPN transistor associated with a given weight in each of said first, second, and third cascodes.

11. The method of claim 9, further comprising:
steering each input of said input differential pairs in proportions to produce a constant magnitude output having a pre-selected phase shift.

12. The method of claim 8, wherein applying the input to the three cascodes further comprises the step of:
applying the input to commonly connected emitter electrodes of each NPN transistor comprising said first cascode, said second cascode and said third cascode.

13. The method of claim 12, further comprising applying the input to a feed line connected to the emitter electrodes of at least two of said first cascode, said second cascode and said third cascode.

* * * * *